United States Patent
Swihart et al.

(10) Patent No.: US 6,962,765 B2
(45) Date of Patent: Nov. 8, 2005

(54) LASER-GENERATED ULTRAVIOLET RADIATION MASK

(75) Inventors: Donald L. Swihart, Stillwater, MN (US); Kevin M. Kidnie, St. Paul, MN (US); Richard C. Buchholtz, Park Ridge, IL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 10/689,468

(22) Filed: Oct. 20, 2003

(65) Prior Publication Data

US 2005/0085385 A1 Apr. 21, 2005

(51) Int. Cl.$^7$ .............................. G03F 1/00; G03F 7/11; G03F 7/34
(52) U.S. Cl. .......................... 430/200; 430/5; 430/201
(58) Field of Search .......................... 430/5, 200, 201

(56) References Cited

U.S. PATENT DOCUMENTS

| | | | |
|---|---|---|---|
| 3,833,441 A | 9/1974 | Heiart | 156/234 |
| 4,626,493 A | 12/1986 | Butters et al. | 430/201 |
| 5,171,650 A | 12/1992 | Ellis et al. | 430/20 |
| 5,256,506 A | 10/1993 | Ellis et al. | |
| 5,278,023 A | 1/1994 | Bills et al. | 430/201 |
| 5,308,737 A | 5/1994 | Bills et al. | 430/201 |
| 5,506,086 A * | 4/1996 | Van Zoeren | 430/201 |
| 5,569,568 A * | 10/1996 | DeBoer | 430/5 |
| 5,576,142 A * | 11/1996 | Neumann et al. | 430/269 |
| 5,695,907 A | 12/1997 | Chang | 430/201 |
| 5,773,170 A | 6/1998 | Patel et al. | 430/5 |
| 5,856,062 A | 1/1999 | Hoshi | 430/203 |
| 5,919,601 A | 7/1999 | Nguyen et al. | 430/278.1 |
| 5,935,758 A | 8/1999 | Patel et al. | 430/200 |
| 5,990,917 A | 11/1999 | Wendt | 347/187 |
| 6,027,849 A | 2/2000 | Vogel | 430/167 |
| 6,165,671 A * | 12/2000 | Weidner et al. | 430/201 |
| 6,242,152 B1 | 6/2001 | Staral et al. | |
| 6,451,500 B1 | 9/2002 | Leon | 430/270.1 |
| 6,451,505 B1 * | 9/2002 | Patel et al. | 430/273.1 |
| 6,458,511 B1 | 10/2002 | Wittig et al. | 430/302 |
| 6,461,793 B2 | 10/2002 | Chang et al. | 430/200 |

FOREIGN PATENT DOCUMENTS

| | | |
|---|---|---|
| EP | 0258836 | 8/1987 |
| EP | 1151872 | 11/2001 |

* cited by examiner

*Primary Examiner*—Richard L. Schilling
(74) *Attorney, Agent, or Firm*—Faegre & Benson LLP

(57) ABSTRACT

A UV-mask, a system and method for making the mask and a method of using the mask for producing an image a print medium are disclosed. The system includes a donor element having a substrate coated with a layer of IR-sensitive material and a layers of UV-absorbing material, and a receptor element. The IR-sensitive material is capable of detaching a significant portion of the itself and the UV-absorbing material from the donor element and transfer the detached materials to the receptor element when irradiated by an IR radiation. The method for making a UV-mask includes irradiating such a donor element with an IR radiation. The method of using includes overlaying a digital UV mask on a UV-sensitive medium, exposing the medium to a UV radiation through the UV mask, and developing the UV-sensitive medium.

4 Claims, 3 Drawing Sheets

LASER-GENERATED ULTRAVIOLET RADIATION MASK

FIELD OF THE INVENTION

The invention relates generally to color printing. More particularly, the invention relates to laser-generated ultraviolet radiation (UV) masks, particularly useful in printing with customized colors.

BACKGROUND OF THE INVENTION

Pre-press or off-press color proofing is used by printers to simulate the images that will be produced by a printing process. Pre-press color proofing systems include overlay proofing systems and surprint, or single sheet, systems. Both overlay proofs and surprint proofs are commonly used as "contract proofs." A contract proof serves as a promise by the printer to a customer that a proofed image will be duplicated by the printing process when the press prints are made. Therefore, the printer desires to have proofs that can most accurately predict the image that will be reproduced by the press prints. The need for accurate proofs is especially critical where custom colors are employed in the printing process.

In an overlay proof, each printing color is generally segregated onto a separate transparent sheet or film, known as an overlay. The number of overlays in an overlay proof will usually equal the number of inks that will be used in the printing process. The individual overlays are assembled in registration to make the overlay proof, which is viewed as a composite against an appropriate background (e.g., an opaque reflective white sheet), to predict the appearance of a printed image. In an overlay proof the individual overlays remain separable and can be viewed separately or superimposed. A number of commercial overlay proofing systems are described in detail in "Principles of Color Proofing," by Michael H. Bruno, GAMA Communications (Salem, N.H. 1986); see especially Chapter V: "Off-Press Color Proofing System-Overlay" (pp 133–146).

Each overlay is made from an overlay proofing film. A traditional overlay proofing film construction includes a substrate and a layer of colored photosensitive material. Photosensitive proofing films which can be used in image-reproduction processes are well-known in the graphics arts industry. Proofing films are usually exposed to radiation through an image-bearing transparency, such as a color-separation transparency, to reproduce the image onto the proofing film. After imagewise exposure, the photosensitive layer may be developed to produce an imaged overlay. Developing is generally done by washout of soluble image areas (e.g., non-exposed areas in a negative-acting transparency), by peeling apart, by toning with a colorant, or combinations of these techniques.

Digital color proofs have been made by directly transferring a colored substance from a "donor" sheet to a "receptor" sheet using a rastering laser beam or an array of laser beams. A donor sheet covered with a layer of ink of a particular stock color, such as cyan, magenta, yellow or black (commonly known as the "CMYK" color system), is juxtaposed with the receptor film, with the ink-side in between. The ink contains an infrared ("IR")-absorbing material. The donor film is exposed to an IR radiation pattern Generally, overlay proofing films are made in large volume and are pre-colored at a factory. Thus, in the production of an overlay proof, the end user is generally limited to those stock colors that are available from the manufacturer. Because of the cost of manufacturing, storing, and distributing overlay proofing film materials, necessarily only a limited range of colors will be available from a manufacturer. The limited range of colors provided by the manufacturer is adequate for many purposes, but does not enable an end user to accurately mimic difficult-to-match colors. For example, many fluorescent or metallic colors are virtually impossible to mimic using the standard process colors cyan, magenta, yellow and black. Even for colors that are theoretically reproducible by standard process colors, the tones of the colors so produced are often not sufficiently precise for specialized applications of the customers.

Methods for making overlay proofs including a custom color are known. U.S. Pat. Nos. 5,001,037 and 5,122,437 to Matthews, et al. report a process for preparing a multi-layered, multi-colored overlay proof comprising at least one precolored overlay image and at least one toned image. The process includes the steps of exposing a non-colored tonable photosensitive overlay element, developing the exposed overlay element, and toning the developed photosensitive element using a toner. U.S. Pat. No. 5,232,814 to Graves, et al. reports color proofing elements for producing images in non-standard colors, and in particular metallic-appearing images. The proofing elements include a support layer and require two layers of pigment.

The invention disclosed herein is aimed at providing a method and system for processing radiation-sensitive patterning compositions substantially without the drawbacks of the conventional approaches.

SUMMARY OF THE INVENTION

Generally, the invention provides a system and method for generating an ultraviolet ("UV") mask by digital laser thermal transfer imaging. The system includes a laser thermal transfer donor element and a receptor element, the donor element having a substrate and a coating at least partially covering the substrate, the coating including a UV-absorbing thermal donor that is capable of selectively transferring the irradiated portion of the coating from the substrate to the receptor element when imagewise exposed to a non-UV radiation such as IR laser radiation.

The method includes selecting a laser thermal transfer donor element and a receptor element, the donor element having a substrate and a coating at least partially covering the substrate, the coating including a UV-absorbing thermal donor that is capable of selectively transferring the irradiated portion of the coating from the substrate to the receptor element when imagewise exposed to a non-UV radiation such as IR laser radiation. The method further includes juxtaposing the donor element with the receptor element, and imagewise exposing the coating to a sufficient amount of non-UV radiation to cause the irradiated portions of the coating to be transferred to the receptor.

The invention also provides a laser thermal transfer donor element having a substrate and a coating at least partially covering the substrate, the coating including a UV-absorbing thermal donor that is capable of selectively separating the irradiated portion of the coating from the substrate when imagewise exposed to a non-UV radiation.

The invention also provides a method of generating an image made of at least two superimposed sub-images, each sub-image being of a different color. In one embodiment, the method includes (a) using a digitally controlled laser source to cause at least a portion of a layer of a coloring agent of a first color from a first donor element to be transferred to a first receptor element; (b) using the same digitally controlled laser source to cause at least a portion of a layer of a UV-absorbing thermal donor to be transferred from a second donor element to a second receptor; (c) overlaying (e.g., by lamination) the first receptor element with a UV-sensitive film; (d) imagewise exposing the UV-sensitive film to a UV-radiation through the second donor element after step (b); and (e) developing the UV-sensitive film. The second receptor element as a result of step (b) may also be used as a UV mask in step (d) if the image quality and UV blocking characteristics of the receptor element are adequate for the purposes of a particular application.

The invention also provides a printed image made by the above method of generating an image.

BRIEF DESCRIPTION OF THE DRAWINGS

Other objects and advantages of the invention will become apparent upon reading the following detailed description and upon reference to the drawings in which.

Figure 1:
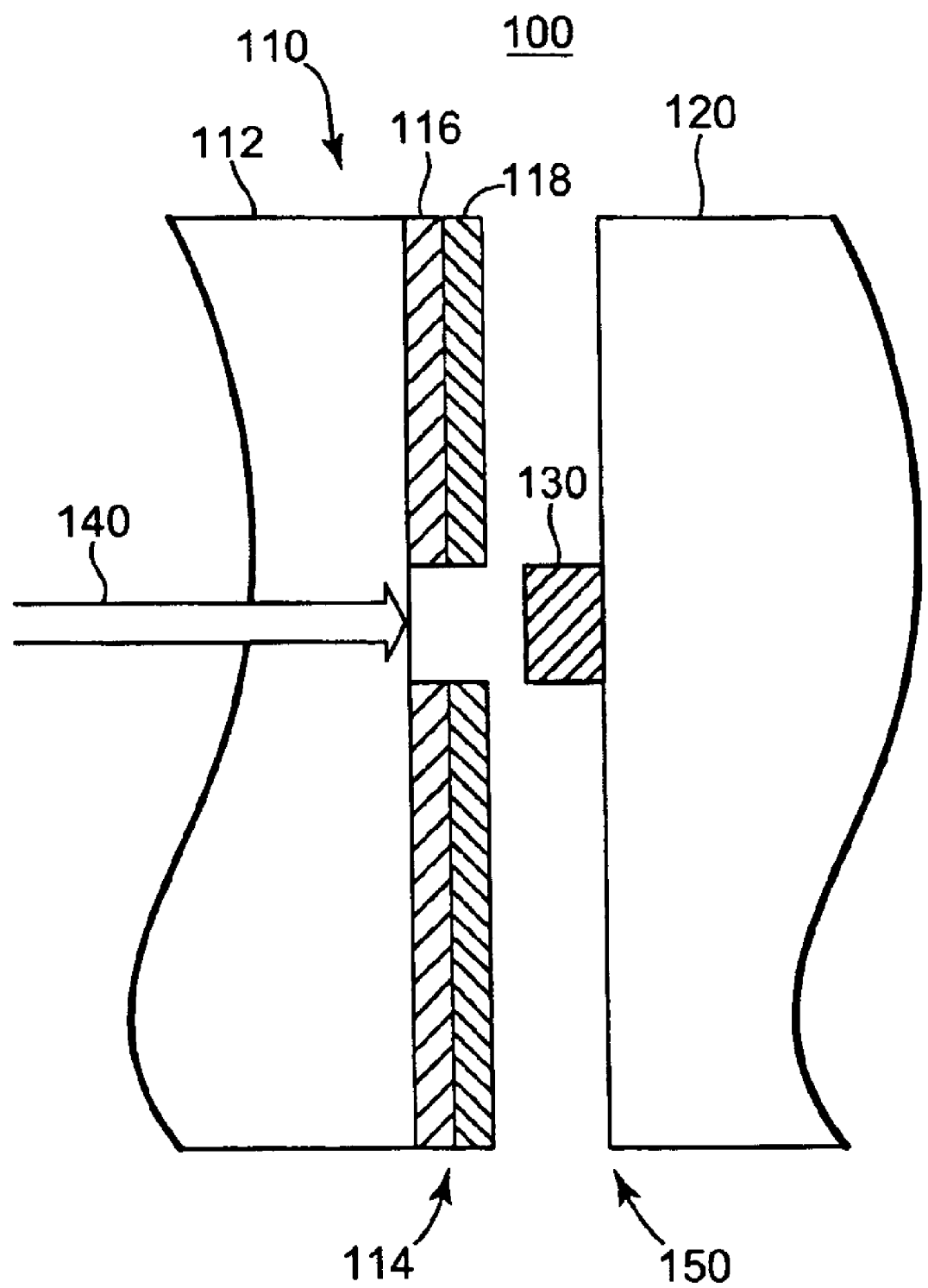
FIG. 1 schematically shows a cross-sectional view of a system for making a UV mask according to one aspect of the invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Referring to FIG. 1, in one embodiment of the invention, a system 100 for producing a UV mask includes a donor element 110 having a substrate 112 and a UV-absorbing coating 114 covering at least a portion of the substrate 112. The coating 114 contains both an IR-sensitive transfer material and an UV-absorbing material. The IR-sensitive transfer material includes a material that causes a portion 130 of the coating 114 to be transferred from the donor element 110 when irradiated by a laser beam 140. The separation need not be 100% complete, so long as a sufficient percentage of the UV-absorbing material in the portion 130 is removed from the donor element.

In an illustrative embodiment, the system 100 is adapted to accomplish the transfer by a laser-induced thermal half-tone imaging process in which the IR-irradiated portions of the coating 114 is softened or melted by the IR radiation and adhere to a receptor substrate 120 or otherwise propelled to the receptor substrate 120. As an example, certain laser-induced mass transfer systems and methods used in making proofs or patterning plates can be adapted to transfer the UV-absorbing coating 114. A UV-absorbing material can be added to the coating, whether or not the IR-sensitive layer itself is a significant UV absorber. Alternatively, certain colorants for proofing purposes simultaneously possess adequate UV-absorbing capabilities; additional UV-absorbing materials may not be necessary in those cases. In either case, the UV-absorbing components of the coating 114 is substantially independent of the IR-sensitive transfer material in that the UV-absorbing capability of the UV-absorbing components is not substantially degraded by the exposure of the coating 114 to an IR radiation.

An example of a laser-induced thermal imaging system and method that provides a half-tone image in the form of discrete dots having well-defined, generally continuous (i.e., without feathering) edges that have relatively sharp profiles is disclosed in the U.S. Pat. No. 5,935,758, which is commonly assigned with the present application and which is incorporated herein by reference. In particular, such a system includes a donor element that includes a substrate on which is coated a transfer material that includes: (a) a binder comprising a hydroxylic resin; (b) a fluorocarbon additive; (c) a cationic infrared absorbing dye; (d) a latent crosslinking agent having the formula:

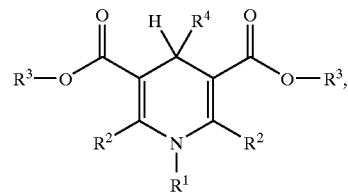

where $R^1$ is selected from the group of H, an alkyl group, a cycloalkyl group, and an aryl group, each $R^2$ and $R^3$ is independently an alkyl group or an aryl group, and $R^4$ is an aryl group; and (e) a dispersible material. The system also includes a receptor element having a texturized surface.

Suitable substrates for the donor include, for example, plastic sheets and films, such as, polyethylene terephthalate, fluorene polyester polymers, polyethylene, polypropylene, acrylics, polyvinyl chloride and copolymers thereof, and hydrolyzed and non-hydrolyzed cellulose acetate. The substrate needs to be sufficiently transparent to the imaging radiation emitted by the laser or laser diode to effect thermal transfer of the corresponding image to a receptor sheet. A preferred substrate for the donor is a polyethylene terephthalate sheet. Typically, the polyethylene terephthalate sheet is about 20 µm to about 200 µm thick. If necessary, the substrate may be surface-treated so as to modify its wettability and adhesion to subsequently applied coatings. Such surface treatments include corona discharge treatment, and the application of subbing layers or release layers.

The receptor element may be transparent or opaque. Suitable receptors include coated paper, metals (i.e., steel and aluminum); films or plates composed of various film-forming synthetic or high polymers including addition polymers (e.g., poly(vinylidene chloride), poly(vinyl chloride), poly(vinyl acetate), polystyrene, polyisobutylene polymers and copolymers), and linear condensation polymers (e.g., poly(ethylene terephthalate), poly(hexamethylene adipate), and poly(hexamethylene adipamide/adipate)). Nontransparent receptor sheets may be diffusely reflecting or specularly reflecting. The receptor element can also be coated with a binder or other materials that facilitate the adhesion of the transferred material.

The IR-sensitive transfer material and UV-absorbing materials in the system 100 in this case are deposited in two separate layers 116 and 118, respectively, with the layer 118 of the UV-absorbing material being on top, but can also be combined in a single layer. The two-layer configuration of the coating 114 shown in FIG. 1 has the advantage that the UV-absorbing material is more likely to be transferred completely from the donor element 110 than in the case of a single layer. Single-layer transfer, however, can also be effective when a sufficient portion of the irradiated material is transferred from the donor element.

After image-wise exposed to an IR radiation, in which the irradiated portions of the coating 114 are lifted from the donor element, the donor element 110 becomes a UV-mask, i.e., one that blocks UV light where the coating 114 remains intact.

As previously noted, the IR-irradiated portion 140 in this case is transferred to a receptor element 120. If the receptor element 120 is substantially UV-transparent, the resultant sheet 150 is a UV-negative of the donor element 110. Depending on the specific application, there may or may not need to be a receptor substrate, and where a receptor substrate is needed, there can be different types of receptor element 120. For example, where laser ablation is used to remove the coating layer, a receptor element may not be necessary for image formation but can be used to trap any substance transferred from the donor element 110. Where a receptor element is needed for removing the IR-irradiated portions from the donor element, the choice of the receptor element 120 is determined by the intended type of UV mask: If only the remaining donor element (typically a negative mask) is to be subsequently used as a mask, the optical and other characteristics of the receptor element are not important so long as the receptor element adequately removes the laser-irradiated portions of the coating 114 from the donor element. In contrast, if the receptor element is to be subsequently used as a UV-mask (typically a positive mask), the substrate must be UV-transparent in addition to being an adequate remover of the IR-irradiated portions of the coating 114 from the donor element. Because the composition and structure of the coating 114 on the donor element it typically more easily controlled, it is often advantageous to produce the UV-mask from the donor element and discard or reuse the receptor element. With digital imaging, one can easily change the setting for making a negative mask to that for a positive mask with the donor by digitally inverting the contrast in the source image file.

A layered structure in the original coating 114 can be, but is not necessarily, preserved in the transferred portion 130. The UV-absorbing material is distributed in a sufficient concentration substantially throughout the transferred portion 130. For clarity of showing the respective substrates 112 and 120 that the IR-exposed portions 130 and portions unexposed to IR adhere to, the receptor substrate 120 is schematically shown to be at some distance from the coating 114. In an actual process of making the mask, depending on the method of transfer, the receptor substrate 120 can be in intimate contact with the coating 114. In certain processes, there may be indeed a gap between the receptor substrate 120 and the coating 114. For example, in one embodiment, a gap of a few micrometers is maintained by spacer beads.

As used in this application, the UV absorption capability of a material (114 or 130, depending on whether the donor or receptor is used as mask) is measured in terms of the difference in absorption before and after the coating material is transferred from the donor element. More precisely, it is defined as $$\log(I_0/I_C) - \log(I_0/I_S), \text{ or}$$

$$\log(I_S/I_C),$$

where $I_0$ denotes the intensity of the UV radiation impinging upon the mask, $I_C$ the intensity after the UV radiation passes through the area with coating, and $I_S$ the intensity after the UV radiation passes through an area with the coating removed.

The UV absorption capability of a coating material has a significant impact on the useful range of UV exposure or dosage through a mask patterned with the material. In assessing the UV absorption characteristics of a material, a test mask containing a series of half-tone screen tints ranging from 0% to 100% (in 5% increments) can be put in contact with a UV-sensitive film. Next, the UV-sensitive film is exposed to one of a series of predetermined dosages of UV radiation through the mask and subsequently developed. The UV exposure is performed a number of times, each time over a previously unexposed UV-sensitive film portion and with a dosage that differs from other exposures by at least one dosage step. Each step increase in dosage, about 40%, corresponds to an increase of about 15% in the density of exposed film.. The useful range of UV exposure, or exposure latitude, is defined in this case as the number of dosage steps over which the UV-exposed and developed film maintains different shades between at least 5% and 95% tint. An exposure latitude of about three steps is typically considered minimally acceptable for commercial applications.

In another illustrative embodiment of the invention, a method of making a UV mask includes placing a donor element and a receptor element as described above in intimate contact with each other, with the coating 114 disposed between the two substrates. The donor element is then exposed to a digitally patterned (or computer-addressable) IR radiation. The IR exposure can be carried out in any suitable digital IR source, including thermal laser imagers that are commonly used for digital proofing, with either a rastered laser beam or an array of laser beams generated by an array of laser-emitting diodes. The receptor is then peeled away, removing the portions of the coating 114 that were exposed to the IR radiation from the donor element. Either the donor or the receptor can be used as a UV mask, depending on the application.

In another embodiment of the invention, a method of making a proof includes first making an IR-generated digital UV mask as above, then exposing a UV-sensitive medium of a particular color to a UV radiation through the UV mask, and then developing the medium.

In another embodiment of the invention, a method for making a multi-color proof includes forming an image of a first color on a UV-sensitive medium as described above, forming at least one digital image of a second color by laser-induced thermal imaging and overlaying the images of the first and second colors. The first color is typically the custom color, and the other color or colors are typically stock color or colors, such as cyan, magenta, yellow and black. Thus, the colors that can be adequately represented by the CMYK color system can be directly reproduced digitally using any variety of the well-known computer-to-proof technology. In particular, a laser-induced thermal imaging system described above can be used. Further, the same computer-to-proof equipment and process for producing the CYMK layers can be used to digitally produce the UV mask needed to print the custom color or colors by the traditional analog method. The CYMK colors can be transferred to the same receptor substrate or separate receptor substrates and then laminated in register. The UV-sensitive medium can then be laminated to the CYMK sheet before being exposed to UV radiation.

The invention can be used in applications where silver halide films are used as UV masks. For example, in addition to proofs, printing plates can also be patterned using UV masks made by the system and process disclosed in this application. The invention offers the advantage of a dry process, as contrasted with the traditional wet chemical photographic process, for making the UV mask. The dry process can be carried out on the same thermal laser imagers that produce the stock color layers and is more user friendly because it is less prone to imperfections from scratching and fingerprinting. The UV mask is also less tacky. The invention also utilizes analog printing of at least one color layer. This feature is particularly useful for printing custom colors, which have become available in a great variety over the long history of analog printing. The analog UV printing equipment is also widely available.

EXAMPLES

Example 1

A High Density ("HD") Yellow Matchprint Digital Halftone media (Kodak Polychrome Graphics, Norwalk, Conn. ("KPG")) was exposed under normal operating conditions in the Creo Trendsetter Spectrum thermal laser imager (Creo Inc., Vancouver, BC). The digital file used was a series of screen tints ranging from 0% to 100% in 5% steps. During the exposure process, the thermal laser irradiated portion of the HD Yellow transfers to a receptor film. After the imaging, the media is ejected from the imager and the exposed HD Yellow donor is used in the next steps. The Receptor is either discarded or reused.

The digitally imaged HD Yellow donor is used as a mask and placed in contact with analog Matchprint Negative Magenta Proofing material (KPG), which had been laminated to a Matchprint Commercial Base (KPG).

This assembly was then placed in a vacuum frame. A vacuum was drawn to form an intimate contact between the donor (digital mask) and analog receptor. The media was the exposed to a UV light source. This was repeated until a series of exposures are obtained at increasing increments. The Matchprint Negative material is then processed through a KPG 2430 Processor (KPG) using Matchprint III Negative Proofing Developer (KPG). The exposure latitude of the mask was then ascertained as described above. In this case with HD Yellow used as a mask, the useful dosage range was four (4) steps.

Example 2

Using the same process as described in Example 1, a High Density Black Matchprint Digital Halftone media (KPG) was exposed in the Creo Laser Imager and used as a UV mask material for the analog Matchprint Proofing media. The acceptable exposure range is approximately three (3) steps.

Example 3

A coating was made using a polyvinyl butyral binder (Butvar B-76, available from Solutia, Inc.) with IR dye as a first layer. In addition, a strong UV absorbing material, Uvinul 3050 (BASF Corp.) was used to form a layer on top of the dye/binder layer. The coatings were exposed as in example 1 and used to expose Matchprint Negative Proofing media. The useful dosage range was over five (5) steps.

Example 4

Coatings of HD Black (KPG) with a Uvinal 3050 top coating were made and used in the process as in Example 1. The resultant UV mask was used to expose Matchprint Negative Proofing media. The useful dosage range was four (4) steps.

Example 5

A White Approval donor (KPG) was exposed in a Creo Trendsetter thermal laser imager at a platen drum speed of 100 rpm and laser power setting of 16.5 watts. The imaged donor was used as a UV mask in the exposure of analog Matchprint Negative Proofing media as described in Example 1. The useful dosage range was seven (7) steps.

Example 6

A Matchprint Digital halftone HiFi Orange media (KPG) was exposed in the Creo Trendsetter under standard operating conditions and used as a UV mask as in Example 1. The useful dosage range was zero steps, i.e., the mask produced no acceptable image under any exposure condition.

Examples 7 and 8

The Yellow and Black media from the Approval Digital halftone system (KPG) were exposed in the Creo Trendsetter imager at the maximum power setting and the imaged donor material was used as a UV mask. The useful dosage range was zero steps for both masks.

Figure 2:
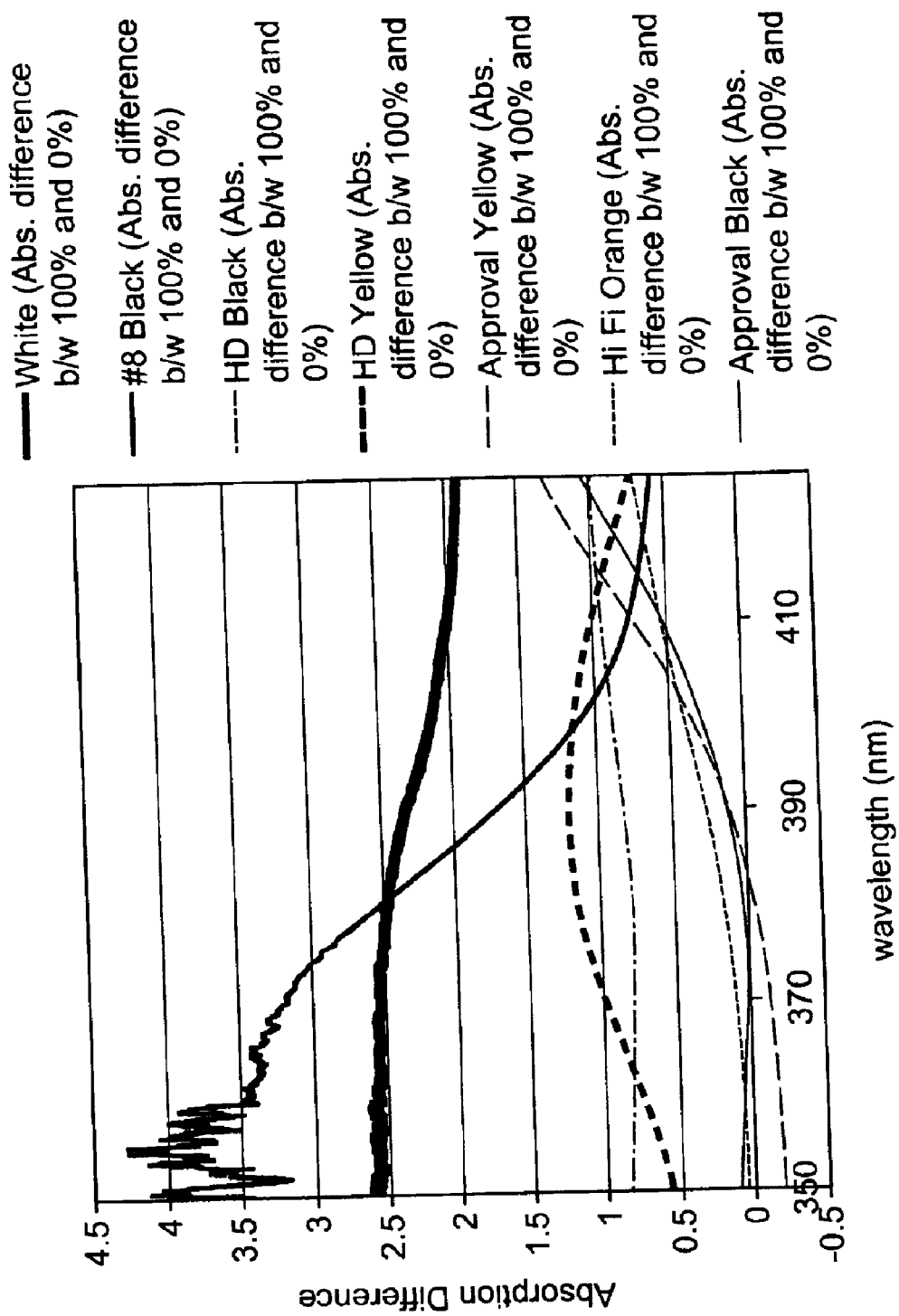
FIG. 2 shows the UV absorption differences characteristics of the various commercially available color donors.
Figure 3:
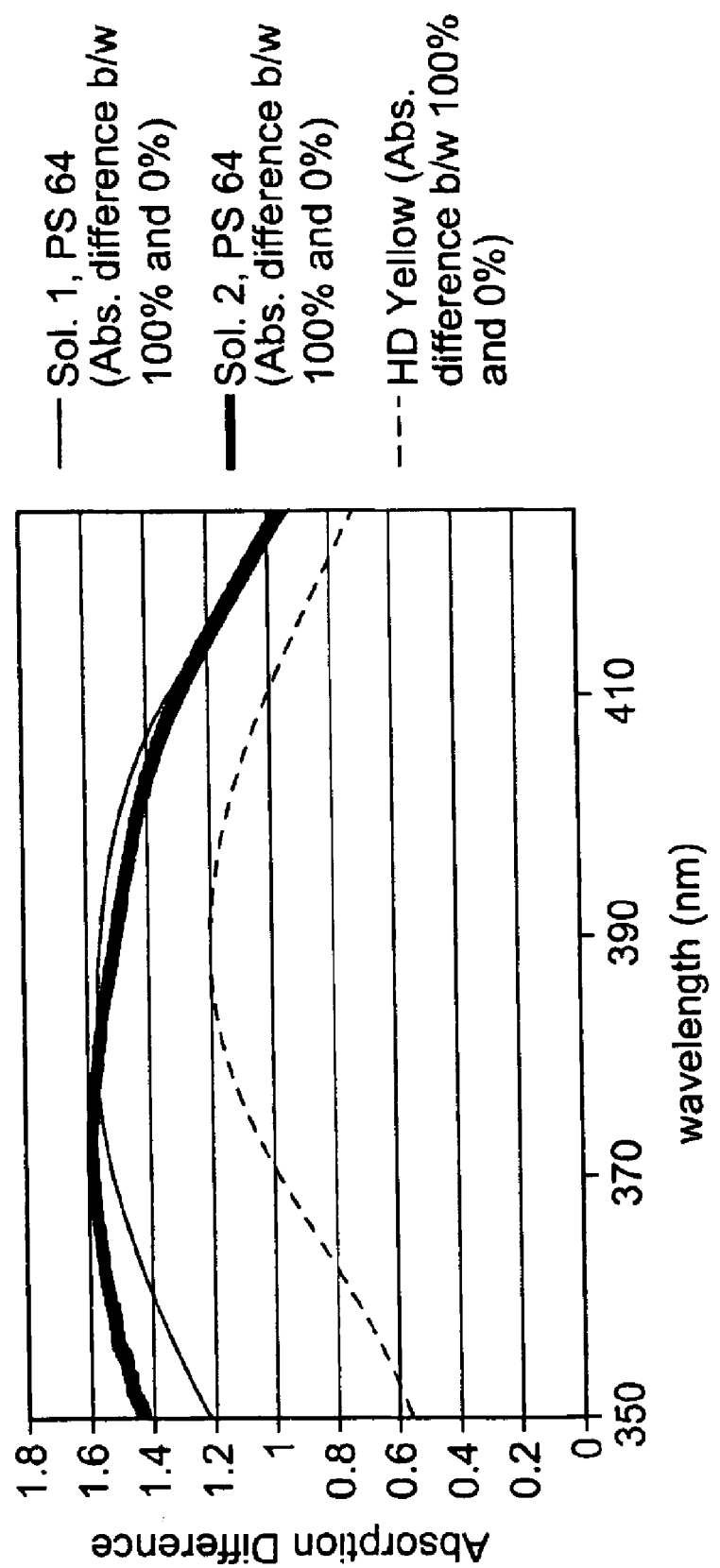
FIG. 3 shows the UV absorption differences of the UV-opaque donor made by adding an highly UV-absorbing material to a commercially available color donor. Absorption differences are generally in the range of 2.5 to 3.5.

The results obtained in the above example can be correlated to the amount of light absorption of the imaged donors between 350 nm to 400 nm, as shown in Table I and FIGS. 2 and 3. Generally, the higher the absorption coefficient, the more useful exposure steps. When the absorption coefficient is below about 1.0, the coating is not suitable for making UV masks.

TABLE I

| Donor Media | Nominal Absorption at 350–400 nm | Exposure Range |
| --- | --- | --- |
| HD Yellow | 0.6 to 1.2 | 4 Steps |
| HD Black | 0.8 to 1.0 | 3 Steps |
| HD Yellow w/ Uvinal 3050 | 1.4 to 1.6 | 5 Steps |
| HD Black w/ Uvinal 3050 | 0.8 to 3.5 | 4 Steps |
| Approval White Donor | 2.0 to 2.6 | 7 steps |
| HiFi Orange | 0.0 to 0.4 | 0 Steps |
| Approval Yellow | −0.2 to 0.3 | 0 Steps |
| Approval Black | 0.0 to 0.3 | 0 Steps |

Using proper colorants and/or colorants with UV absorbers, a mask can be generated that provides sufficient UV dosage latitude for the exposure of analog systems.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A system for making a UV-absorbing pattern, the system comprising:
    a donor element comprising:
        a substrate,
        a layer of IR-sensitive, non-ablative transfer material coating at least a portion of the substrate,
        a layer of UV-absorbing material coating the IR-sensitive transfer material,
        wherein the layers of the IR-sensitive material and UV-absorbing material have a combined UV-absorption coefficient of at least about 1.0; and
    a receptor element.

2. The system of claim 1, wherein the IR-sensitive transfer material comprises:
    a binder comprising a hydroxylic resin,
    a fluorocarbon additive,
    a cationic infrared absorbing dye,
    a latent crosslinking agent having the formula:

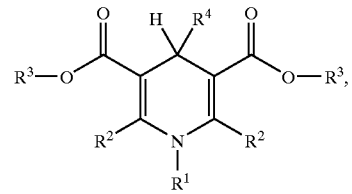

where $R^1$ is selected from the group of H, an alkyl group, a cycloalkyl group, and an
    aryl group, each $R^2$ and $R^3$ is independently an alkyl group or an aryl group, and $R^4$ is
    an aryl group, and
    a dispersible material, and
    wherein the receptor element comprises a textured surface.

3. A method for making a UV mask, the method comprising:
    providing a system of claim 1;
    exposing the donor element to a digital image-wise IR laser radiation; and transferring substantially all of the IR laser-irradiated portions of the layer of IR-sensitive material and layer of UV-absorbing material from the donor element to the receptor element.

4. The method of claim 3, wherein the digital images-wise IR laser radiation produces a half-tone image pattern in the layer of IR-sensitive material and layer of UV-absorbing material.

* * * * *